United States Patent
Sano

(10) Patent No.: US 11,104,992 B2
(45) Date of Patent: *Aug. 31, 2021

(54) SUBSTRATE PROCESSING APPARATUS, NON-TRANSITORY COMPUTER-READABLE RECORDING MEDIUM THEREOF AND SEMICONDUCTOR MANUFACTURING METHOD BY EMPLOYING THEREOF

(71) Applicant: HITACHI KOKUSAI ELECTRIC INC., Tokyo (JP)

(72) Inventor: Atsushi Sano, Toyama (JP)

(73) Assignee: KOKUSAI ELECTRIC CORPORATION, Tokyo (JP)

(*) Notice: Subject to any disclaimer, the term of this patent is extended or adjusted under 35 U.S.C. 154(b) by 332 days.

This patent is subject to a terminal disclaimer.

(21) Appl. No.: 16/139,784

(22) Filed: Sep. 24, 2018

(65) Prior Publication Data

US 2019/0024231 A1    Jan. 24, 2019

Related U.S. Application Data

(63) Continuation of application No. 15/141,580, filed on Apr. 28, 2016, now Pat. No. 10,106,891, which is a
(Continued)

(51) Int. Cl.
*C23C 16/44* (2006.01)
*H01L 21/3205* (2006.01)
(Continued)

(52) U.S. Cl.
CPC .......... *C23C 16/4412* (2013.01); *C23C 16/06* (2013.01); *C23C 16/4583* (2013.01);
(Continued)

(58) Field of Classification Search
CPC . C23C 16/4583; C23C 16/54; C23C 16/4412; C23C 16/06; C23C 16/56;
(Continued)

(56) References Cited

U.S. PATENT DOCUMENTS 6,716,477 B1    4/2004    Komiyama et al.
9,076,116 B2    7/2015    Furbeck et al.
(Continued)

FOREIGN PATENT DOCUMENTS

CN    102237262 A    11/2011
JP    2006-124784 A    5/2006
(Continued)

OTHER PUBLICATIONS

English Translation of KR 1020060122420 Nov. 30, 2006.*

*Primary Examiner* — Jeffrie R Lund
(74) *Attorney, Agent, or Firm* — Volpe Koenig

(57) ABSTRACT

Embodiments of the invention relate to a substrate processing apparatus. In one embodiment, a substrate processing apparatus includes a plurality of process units. The process unit includes a process chamber for processing a substrate, an exhaust conduit connected to the process chamber and an exhaust pump arranged in the path of the exhaust conduit. The substrate processing apparatus further includes a connecting conduit connected to the exhaust conduits of the process units in the upstream of the exhaust pump and a switching unit which switches an exhaust path of the process chamber to the other exhaust pump in the other process unit via the connecting conduit.

10 Claims, 8 Drawing Sheets

Related U.S. Application Data continuation of application No. 14/494,085, filed on Sep. 23, 2014, now Pat. No. 9,353,438.

(51) Int. Cl.

| | | |
|---|---|---|
| *C23C 16/06* | (2006.01) | |
| *C23C 16/56* | (2006.01) | |
| *C23C 16/46* | (2006.01) | |
| *C23C 16/52* | (2006.01) | |
| *C23C 16/54* | (2006.01) | |
| *H01L 21/67* | (2006.01) | |
| *C23C 16/458* | (2006.01) | |
| *H01L 21/02* | (2006.01) | |

(52) U.S. Cl.
CPC .............. *C23C 16/46* (2013.01); *C23C 16/52* (2013.01); *C23C 16/54* (2013.01); *C23C 16/56* (2013.01); *H01L 21/02186* (2013.01); *H01L 21/02271* (2013.01); *H01L 21/32051* (2013.01); *H01L 21/67017* (2013.01); *H01L 21/6719* (2013.01)

(58) Field of Classification Search
CPC ... C23C 16/46; C23C 16/52; H01L 21/02186; H01L 21/02271; H01L 21/6719; H01L 21/67017; H01L 21/32051; H01L 21/02
USPC ...................................... 118/715; 156/345.29
See application file for complete search history.

(56) References Cited

U.S. PATENT DOCUMENTS

| | | | |
|---|---|---|---|
| 9,353,438 B2 | 5/2016 | Sano | |
| 10,106,891 B2 * | 10/2018 | Sano | H01L 21/02271 |
| 10,535,501 B2 * | 1/2020 | Tonegawa | H01J 37/32834 |
| 10,978,315 B2 * | 4/2021 | Shiokawa | H01J 37/32844 |
| 2004/0013531 A1 * | 1/2004 | Curry | F04D 19/04 |
| | | | 417/42 |
| 2005/0000436 A1 | 1/2005 | Muller et al. | |
| 2005/0045821 A1 * | 3/2005 | Noji | H01J 37/05 |
| | | | 250/311 |
| 2005/0142010 A1 | 6/2005 | Bailey et al. | |
| 2005/0147509 A1 | 7/2005 | Bailey et al. | |
| 2009/0188624 A1 * | 7/2009 | Bera | H01L 21/6719 |
| | | | 156/345.29 |
| 2009/0208649 A1 | 8/2009 | Bailey | |
| 2010/0071548 A1 | 3/2010 | Smith | |
| 2010/0126605 A1 | 5/2010 | Stones | |
| 2011/0265951 A1 | 11/2011 | Xu et al. | |
| 2014/0130907 A1 * | 5/2014 | Watanabe | G05D 16/024 |
| | | | 137/487.5 |
| 2014/0168826 A1 * | 6/2014 | Kalbeck | B60T 17/221 |
| | | | 361/22 |
| 2014/0291411 A1 * | 10/2014 | Tamaki | F24D 17/001 |
| | | | 237/2 B |
| 2014/0352820 A1 | 12/2014 | Nakazawa et al. | |
| 2014/0356550 A1 | 12/2014 | Tonegawa et al. | |
| 2015/0292082 A1 * | 10/2015 | Sano | C23C 16/46 |
| | | | 438/5 |
| 2016/0237560 A1 | 8/2016 | Sano | |
| 2017/0350395 A1 | 12/2017 | Schofield et al. | |
| 2019/0024231 A1 * | 1/2019 | Sano | H01L 21/67017 |

FOREIGN PATENT DOCUMENTS

| | | |
|---|---|---|
| JP | 2012-064857 A | 3/2012 |
| KR | 10-2006-0122420 A | 8/2014 |

* cited by examiner

SUBSTRATE PROCESSING APPARATUS, NON-TRANSITORY COMPUTER-READABLE RECORDING MEDIUM THEREOF AND SEMICONDUCTOR MANUFACTURING METHOD BY EMPLOYING THEREOF

CROSS-REFERENCE TO RELATED APPLICATION

This U.S. Non-Provisional patent application is a continuation of U.S. patent application Ser. No. 15/141,580 filed on Apr. 28, 2016, which is a continuation of U.S. patent application Ser. No. 14/494,085 filed on Sep. 23, 2014 (issued as U.S. Pat. No. 9,353,438) and claims priority under 35 U.S.C. § 119 to Japanese Patent Application No. 2014-091302 filed on Apr. 15, 2014, the entire contents of which are hereby incorporated by reference.

FIELD

Embodiments of the invention generally relate to substrate processing apparatus, non-transitory computer-readable recording medium therefor.

BACKGROUND

In the field of substrate processing apparatus including semiconductor manufacturing apparatus, generally an exhaust pump is connected to a process chamber for processing a substrate. Exhausting the process chamber of gases is performed by the exhaust pump.

Japanese Patent Application Laid-Open Publication No. 2012-64857 discloses a substrate processing apparatus having an exhaust pump.

When abnormality or accident of the exhaust pump connected to the process chamber occurs, a desired process may not be performed under using such a broken pump. During the changing of a broken pump or periodical maintenance, production downtime which can't process a substrate may occur.

In accordance with the present invention, influence on processing a substrate based on the abnormality or maintenance of pump can be reduced.

SUMMARY

A substrate processing apparatus is provided herein. In some embodiments, a substrate processing apparatus is provided which includes a plurality of process units. The process unit includes a process chamber for processing a substrate, an exhaust conduit connected to the process chamber and an exhaust pump arranged in the path of the exhaust conduit. The substrate processing apparatus further includes a connecting conduit connected to the exhaust conduits of the process units in the upstream of the exhaust pump and a switching unit which may switch an exhaust path of the process chamber to the other exhaust pump in the other process unit via the connecting conduit.

In another embodiment, a semiconductor manufacturing method by employing a plurality of process units is provided. The process unit includes a process chamber for processing a substrate, an exhaust conduit connected to the process chamber and an exhaust pump arranged in the path of the exhaust conduit is provided. The method includes a step of processing the substrate while exhausting the process chamber via a connecting conduit connected to the exhaust conduits of the process units in the upstream of the exhaust pump, utilizing the exhaust pump which is different from the exhaust pump in the process unit.

In another embodiment, a non-transitory computer-readable recording medium storing a program for manufacturing a semiconductor device by employing a plurality of process units is provided. The process unit includes a process chamber for processing a substrate, an exhaust conduit connected to the process chamber and an exhaust pump arranged in the path of the exhaust conduit is provided.

The program causes a computer to execute the step of processing the substrate while exhausting the process chamber via a connecting conduit connected to the exhaust conduits of the process units in the upstream of the exhaust pump, utilizing the exhaust pump which is different from the exhaust pump in the process unit.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

DESCRIPTION OF THE PREFERRED EMBODIMENT(S)

First Embodiment

Configuration of the substrate processing apparatus and its operation as a first embodiment in accordance with the present invention is described below.

(1) Configuration of the Substrate Processing Apparatus

Figure 1:
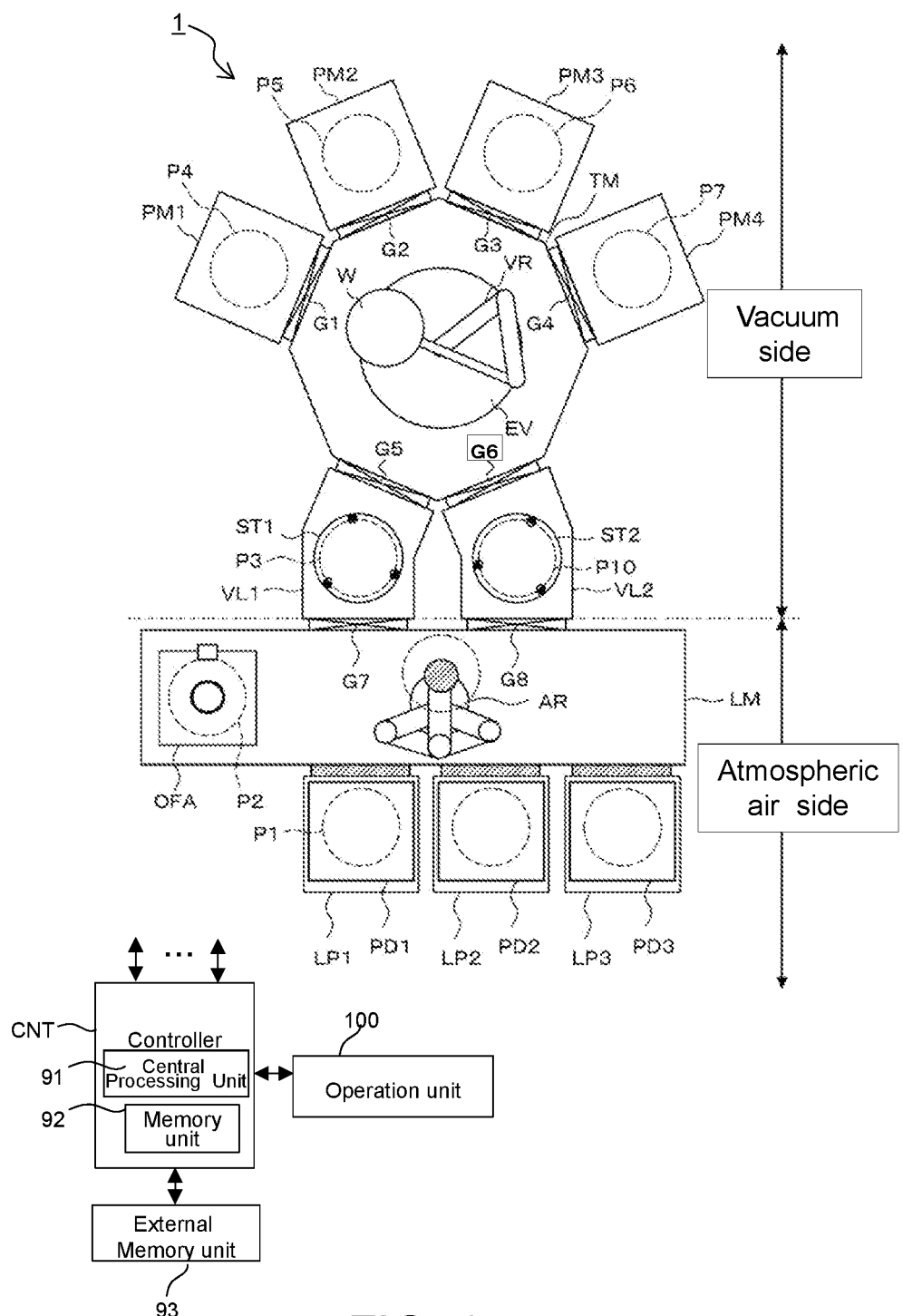
FIG. 1 is a schematic top view diagram of one example of a substrate processing apparatus which may be adopted to perform the processes disclosed herein.
Figure 2:
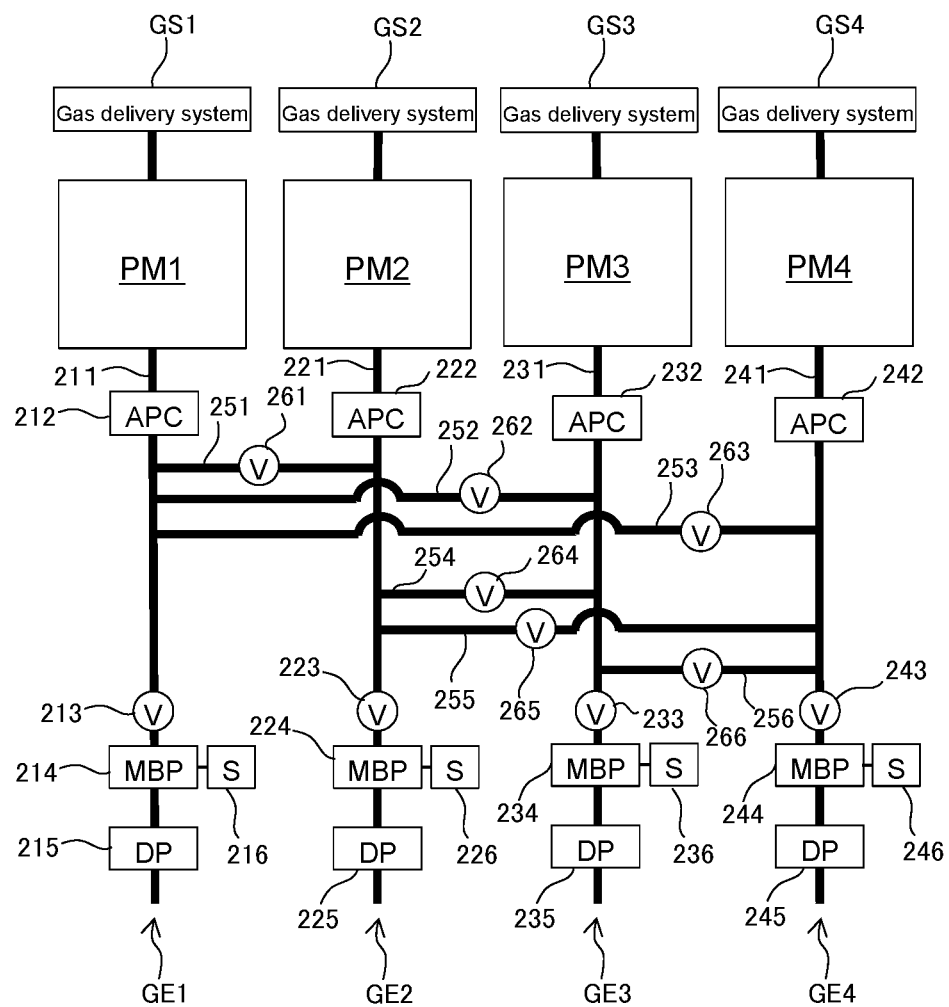
FIG. 2 is a diagram showing a gas delivery system and a gas exhaust system in the substrate processing apparatus shown in FIG. 1.

FIG. 1 and FIG. 2 show the configuration of the substrate processing apparatus as a first embodiment in accordance with the present invention.

FIG. 1 is a schematic top view diagram of one example of a substrate processing apparatus which may be adopted to perform the processes disclosed herein. FIG. 2 is a diagram showing a gas delivery system and a gas exhaust system in the substrate processing apparatus shown in FIG. 1.

The substrate processing apparatus 1 in accordance with the embodiment of the present invention is configured as a cluster type apparatus having a plurality of processing units which handles a substrate one piece at a time. As shown in FIG. 1, the substrate processing apparatus 1 includes vacuum transfer chamber TM for transferring a wafer between plural chambers under a sealed vacuum state, vacuum lock chambers VL1, VL2 for maintaining a load lock state and process chambers PM1, PM2, PM3, PM4 for processing wafer W as a substrate. Vacuum lock chambers VL1, VL2 and process chambers PM1, PM2, PM3, PM4 are arranged into a cluster form along circumference of transfer chamber TM. Process chambers PM1, PM2, PM3, PM4 are simply expressed with process chamber PM when they are not in particular necessary to distinguish them hereafter.

Vacuum transfer chamber TM is comprised for the load lock chamber that can endure a negative pressure such as the vacuum state less than atmospheric pressure. In addition, in one embodiment of this invention, the housing of vacuum transfer chamber TM can be formed like an octagonal box shape.

Vacuum transfer robot VR as transportation mechanism of substrates may be disposed in vacuum transfer chamber TM. By setting a wafer W on the arm of vacuum transfer robot VR, Vacuum transfer robot VR may transfer the wafer W between vacuum lock chambers VL1, VL2 and process chamber PM. In addition, vacuum transfer robot VII may elevate under maintaining airtightness of the vacuum transfer chamber TM by elevator EV.

The film such as an oxide film, a nitride film or a metal film may be formed on wafer W in process chamber PM. In this embodiment, a metal film may be formed in process chamber PM.

Process chamber PM1, PM2, PM3, PM4 may be communicated to vacuum transfer chamber TM through gate valve G1, G2, G3, G4. For example, when wafer W may be processed in process chamber PM1, the degree of vacuum in process chamber PM1 may be set to become approximately equal to the degree of vacuum in vacuum transfer chamber TM, then gate valve G1 may be opened and wafer W may be transferred to process chamber PM1, then gate valve G1 may be closed. Process chamber PM2-PM4 can also make a processing atmosphere for wafer W by opening and closing gate valve G2-G4 like gate valve G1.

Vacuum lock chamber VL1, VL2 may work as a preliminary chamber for transferring wafer W to vacuum transfer chamber TM or transferring wafer W from vacuum transfer chamber TM. Buffer stage ST1, ST2 to support wafer W temporarily when wafer W is carried in/from vacuum transfer chamber TM may be disposed in vacuum lock chamber VL1, VL2 respectively. A cooling function to cool wafer W may be included in vacuum lock chamber VL1, VL2 (not illustrated). In addition, separately from vacuum lock chamber VL1, VL2, the chamber for the cooling may be disposed.

Vacuum lock chamber VL1, VL2 may be communicated to vacuum transfer chamber TM through gate valve G5, G6 respectively and may be communicated to atmosphere transfer chamber LM through gate valve G7, G8 respectively. To maintain a condition of the vacuum in vacuum transfer chamber TM or a condition of atmosphere in atmosphere transfer chamber LM, either gate valve G5 or G7 disposed at vacuum lock chamber VL1 is closed by all means and these valves may be not opened at the same time. Either gate valve G6 or G8 disposed at the vacuum lock chamber VL2 is also closed by all means. These valves may be also not opened at the same time. For example, when gate valve G5 with respect to vacuum transfer chamber TM is opened, contralateral gate valve G7 may be closed by all means, then a pressure in vacuum lock chamber VL1 may be maintained in vacuum. The terminology "vacuum" in this specification, claims or abstract means industrial vacuum, not limited to significance of the vacuum literally. When gate valve G7 with respect to atmosphere transfer chamber LM may be opened, contralateral gate valve G5 may be closed by all means. Therefore, a pressure in vacuum lock chamber VL1 may be maintained in atmosphere. Thus, wafer W may be transferred between vacuum lock chamber VL1, VL2 and atmosphere transfer chamber LM under maintaining the vacuum condition in vacuum transfer chamber TM by opening gate valve G7, G8 with closing gate valve G5, G6.

In addition, vacuum lock chamber VL1, VL2 is comprised for the load lock chamber that can endure a negative pressure such as a condition of the vacuum less than atmospheric pressure. The inside of vacuum lock chamber VL1, VL2 can be evacuated respectively. Therefore, wafer W may be transferred between vacuum lock chamber VL1, VL2 and vacuum transfer chamber TM under maintaining the vacuum condition in vacuum transfer chamber TM by opening gate valve G5, G6 after evacuating vacuum lock chamber VL1, VL2 with closing gate valve G7, G8.

The substrate processing apparatus further may include atmosphere transfer chamber LM communicated to vacuum lock chamber VL1, VL2 and load port LP1, LP2, LP3 as substrates storing part. Load port LP1, LP2, LP3 may be communicated to atmosphere transfer chamber LM. Pod PD1, PD2, PD3 as substrates storing container can be disposed on load port LP1, LP2, LP3.

There are some slots for receiving each wafer W in pod PD1, PD2, PD3 respectively. Load ports LP1, LP2, LP3 are simply expressed with load port LP when they are not in particular necessary to distinguish them hereafter. Pods PD1, PD2, PD3 are simply expressed with pod PD when they are not in particular necessary to distinguish them hereafter.

Atmosphere transfer robot AR as a transportation mechanism of the substrates in the atmosphere may be disposed in atmosphere transfer chamber LM. Atmosphere transfer robot AR may transfer the wafer W between vacuum lock chambers VL1, VL2 and pod PD on load port LP. In addition, atmosphere transfer robot AR may also include an arm for setting a wafer W on it like the arm of vacuum transfer robot VR.

In addition, atmosphere transfer chamber LM may include adjusting device of the orientation flat OFA or adjusting device of notch as a device for compensation of the substrate position. These devices may align the position of wafer W based on the crystal orientation of wafer W indicated by the orientation flat or notch of wafer W.

Each configuration mentioned above may be connected to controller CNT. Controller CNT generally includes a central processing unit 91, a memory unit 92 and support circuits. Controller CNT may be connected to operation unit 100. Operation unit 100 includes the combination of a display device and a keyboard or a touchscreen. Operation unit 100 may receive various indications from an operator to operate substrate processing unit 1 and may transmit them to controller CNT. Operation unit 100 may display information (operation information or abnormal information) of substrate processing unit 1 output by controller CNT.

Furthermore, a temperature adjustor for adjusting the temperature of wafer W in process chamber PM, a gas delivery system to deliver process gases to process chamber PM or a gas exhaust system to exhaust process gases from process chamber may be connected to controller CNT. Controller CNT may load the program or recipe from memory unit 92, according to the indication input by an operator via operation unit 100 or host computer (not illustrated). Then, controller CNT may execute the desired process to the wafer W by controlling some configurations of substrate processing apparatus 1.

In addition, controller CNT may comprise an exclusive computer or may comprise a general-purpose computer. For example, controller CNT may be configured by installing the above mentioned program to the general-purpose computer utilizing an external memory unit 93 like a magnetic tape, a magnetic disk such as a flexible disc or a hard disk, optical disk such as a CD or a DVD, a magneto-optical disk such as an MO or a semiconductor memory included in such as a USB memory (USB Flash Drive) or the memory card etc.

In addition, the means to install the program to a computer are not limited to the means supplying it through external memory unit 93. For example, installing the program by using the means of communications such as the Internet or the exclusive line, without external memory unit 93, can be possible.

In addition, memory unit 92 or external memory unit 93 are comprised as the recording medium that computer reading is possible. Merely recording medium means these memories collectively. When the terminology "recording medium" is used in this specification, claims or abstract, the terminology is defined as just the memory unit 92, external memory unit 93 or both of memory unit 92 and external memory unit 93.

Next, a gas delivery system and a gas exhaust system are explained. As shown in FIG. 2, gas delivery system GS1, GS2, GS3, GS4 may be connected to process chamber PM1, PM2, PM3, PM4 respectively. Gas delivery system GS1, GS2, GS3, GS4 are simply expressed with "gas delivery system GS" when they are not in particular necessary to distinguish them hereafter.

Gas delivery system GS may include a source of process gas, a valve for opening or closing a flow of process gas and a mass flow controller for controlling a flow rate of process gas. Gas delivery system GS may deliver the gases for processing wafer W to process chamber PM or for cleaning process chamber PM.

Processing wafer W may be a process to form metallic thin film herein. In this embodiment, titanium nitride (TiN) film used for the gate electrode of the transistor for one of the metallic thin films shall be formed. As a configuration necessary for film formation of titanium nitride (TiN), gas delivery system GS may include a source of titanium tetrachloride ($TiCl_4$) as a metal source gas, a source of ammonia ($NH_3$) as a nitriding agent, a source of nitrogen ($N_2$) as an inert gas, a valve and a mass flow controller for controlling feed and discharge of each gas. Furthermore, as a configuration necessary for cleaning process chamber PM, gas delivery system GS may include a source of cleaning gas (for example, nitrogen trifluoride ($NF_3$)) and a valve and a mass flow controller for controlling feed and discharge of the cleaning gas. In addition, in this specification, claims or abstract, a gas for forming a film or cleaning the inside of process chamber PM may be defined as "a process gas" collectively.

In addition, gas exhaust system GE1, GE2, GE3, GE4 may be connected to process chamber PM1, PM2, PM3, PM4 respectively. Gas exhaust system GE1, GE2, GE3, GE4 are simply expressed with "gas exhaust system GE" when they are not in particular necessary to distinguish them hereafter.

Gas exhaust system GE1 may include exhaust conduit 211, APC (Auto Pressure Controller) 212, valve (valve body) 213, MBP (Mechanical Booster Pump) 214, DP (Dry Pump) and sensor 216 attached to MBP 214. APC 212, valve 213, MBP 214, DP 215 may be arranged as needed sequentially by the upstream of exhaust conduit 211. They may be connected to controller CNT mentioned above.

APC 212 may have a valve body which opening degree may be adjustable. Depending on the indication from controller CNT, APC 212 may control a pressure in process chamber PM1 by adjusting a conductance of exhaust conduit 211 by regulating the opening degree of the valve body. MBP 214 is a high vacuum (or ultra-high vacuum) pump. Depending on the indication from controller CNT, an atmosphere in process chamber PM1 may be exhausted. Depending on the indication from controller CNT, DP 215 may exhaust process chamber PM1 from low rough vacuum to atmospheric pressure as auxiliary pump of MBP 214. In addition, sensor 216 may detect the abnormality such as accidents of MBP 214 or DP 215. Here, the abnormality of MBP 214 or DP 215 detected by sensor 216 may include not only accidents but also an abnormality which may affect the ability for exhaust at processing wafer W when an operation is continued. The abnormality of MBP 214 or DP 215 may be detected by number of revolutions, watt consumption, a temperature of MBP 214 or DP 215, a pressure of exhaust conduit 211 of the MBP 214 or DP 215 vicinity or those combinations. In other words, sensor 216 may detect these parameters and output the detective effects to controller CNT. For example, MBP 214 or DP 215 may be judged with an abnormality when the number of its revolution decreases, its watt consumption rise, its temperature rises or a pressure of exhaust conduit 211 rises in comparison with a stationary state of MBP 214, DP 215 or exhaust conduit 211. The terminology "abnormality of MBP" in this specification or claims includes not only the abnormality of MBP but also the abnormality of DP if attached.

Gas exhaust system GE2, GE3, GE4 may include respectively exhaust conduit 221, 231, 241, APC 222, 232, 242, valve 223, 233, 243, MBP 224, 234, 244, DP 225, 235, 245, Sensor 226, 236, 246 like Gas exhaust system GE1. These configurations of GE2, GE3, GE4 may be connected to controller CNT respectively.

In this specification, claims or abstract, a configuration including process chamber PM, gas delivery system GS connected to process chamber PM and gas exhaust system GE connected to process chamber PM may be named as "process unit". The configuration including process chamber PM, exhaust conduit connected to process chamber PM, valve or APC disposed at exhaust conduit and an exhaust pump (For example, MBP or DP or combination of them) disposed at exhaust conduit may also be called with "process unit". An example of an exhaust pump may include a pump such as MBP or DP, but is not limited to these pumps. The pump to exhaust gas of process chamber PM may be one pump or a combination of some pumps including a pump with different functions like MBP or DP.

A substrate processing apparatus may include connecting conduit 251, 252, 253, 254, 255, 256 to connect an exhaust conduit of each process unit to in the upstream of the exhaust pump (MBP). In other words, each exhaust conduit 211, 221,231,241 may be connected by connecting conduit 251, 252, 253, 254, 255, 256 mutually each. Specifically, exhaust conduit 211 may be connected to exhaust conduit 221 by connecting conduit 251 in upstream of MBP 214, 224 and downstream of APC 212, 222. Exhaust conduit 211 may be connected to exhaust conduit 231 by connecting conduit 252 in upstream of MBP 214, 234 and downstream of APC 212, 232. Exhaust conduit 211 may be connected to exhaust conduit 241 by connecting conduit 253 in upstream of MBP 214, 244 and downstream of APC 212, 242. Exhaust conduit 221 may be connected to exhaust conduit 231 by connecting conduit 254 in upstream of MBP 224, 234 and downstream of APC 222, 232. Exhaust conduit 221 may be connected to exhaust conduit 241 by connecting conduit 255 in upstream of MBP 224, 244 and downstream of APC 222, 242. Exhaust conduit 231 may be connected to exhaust conduit 241 by connecting conduit 256 in upstream of MBP 234, 244 and downstream of APC 232, 242.

Valve 213,223,233,243 may be disposed in downstream of a connection point of connecting conduit 251, 252, 253, 254, 255, 256 in exhaust conduit 211, 221, 231, 241 respectively. Connecting conduit 251, 252, 253, 254, 255, 256 may include valve 261, 262, 263, 264, 265, 266 respectively. Valve 261, 262, 263, 264, 265, 266 may also be connected to controller CNT respectively.

Switching the exhaust path of the process chamber PM is explained by exemplifying process chamber PM1 herein. Process chamber PM1 is usually exhausted by MBP 214, or MBP 214 with DP 215, disposed to exhaust conduit 211. At this time, valve 213 in exhaust conduit 211 is opened and valve 261 in connecting conduit 251, valve 262 in connecting conduit 252 and valve 263 in connecting conduit 253 are closed.

Process chamber PM1 can exhaust it by exhaust pumps MBP 224, 234, 244, or MBP 224, 234, 244 with DP 225, 235, 245 respectively, disposed in exhaust conduit 221, 231, 241 for another process unit PM2, PM3, PM4. For example, by closing valve 213 in exhaust conduit 211 and opening valve 261 in connecting conduit 251 and valve 223 in exhaust conduit 221, process chamber PM1 can communicate with MBP 224, or MBP 224 and DP 225 in exhaust conduit 221, for originally exhausting process chamber PM2. Thus, exhaust path for process chamber PM1 can be switched. The opening of APC 222 in exhaust conduit 221 is assumed closing it and valve 262,263,264,265 in connecting conduit 252, 253, 254, 255 are closed. Similarly, by controlling each valve or APC in each gas exhaust system GE, the process chamber PM can be respectively exhausted by using MBP or DP disposed in the exhaust conduit connected to another process chamber PM. In other words, the switching unit which switches an exhaust path of the process chamber to another exhaust pump in another process unit may include a valve or APC in gas exhaust system GE.

(2) Substrate Processing Process

Figure 3:
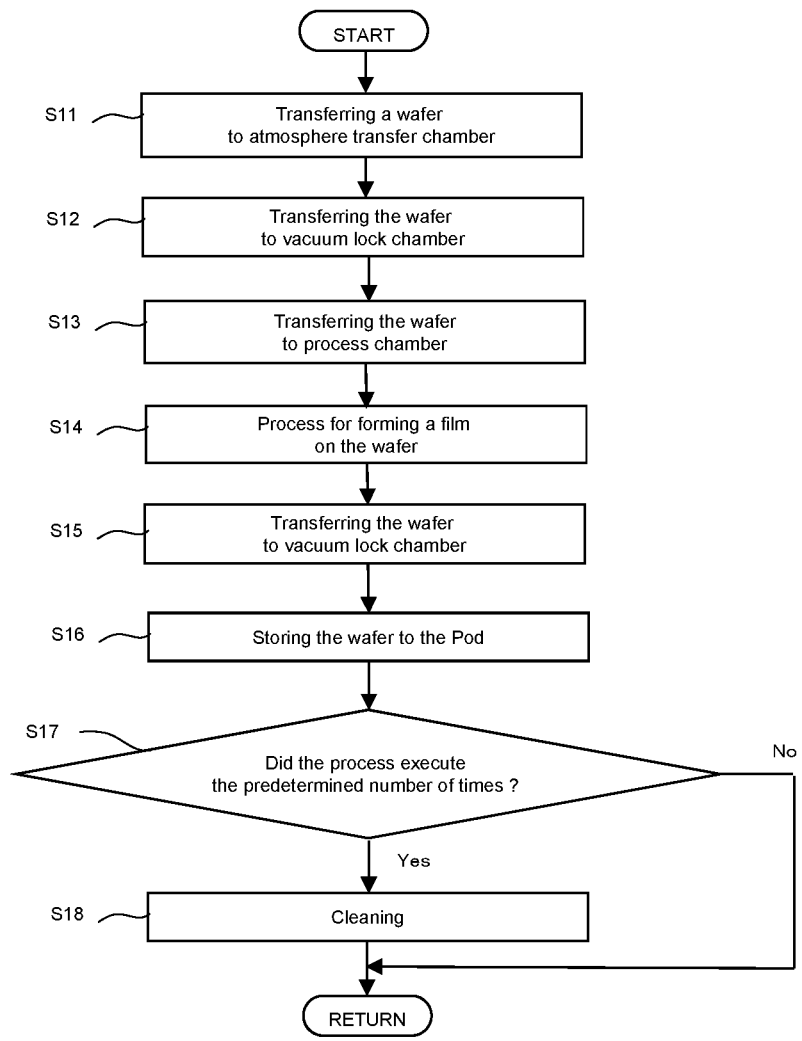
FIG. 3 is a flowchart for explaining substrate processing steps performing on the substrate processing apparatus shown in FIG. 1.

Next, an embodiment of substrate processing process by employing substrate processing apparatus 1 is explained with reference to FIG. 3. FIG. 3 is a flowchart for explaining a substrate processing steps practicing on the substrate processing apparatus shown in FIG. 1. The following processes are carried out by controlling an operation of each configuration of substrate processing apparatus 1 by controller CNT.

As shown in FIG. 3, wafer W may be transferred from pod PD on load port LP to atmosphere transfer chamber LM by Atmosphere transfer robot AR (S11). Clean air may be supplied to atmosphere transfer chamber LM so that a pressure in atmosphere transfer chamber LM may approximately become atmospheric pressure. The crystal orientation of wafer W may be adjusted by setting wafer W on specific position P2 at the adjusting device of the orientation flat OFA (not illustrated) in atmosphere transfer chamber LM.

Next, wafer W may be picked up from position P2 at adjusting device of the orientation flat OFA by atmosphere transfer robot AR and may transfer to position P3 on buffer stage ST1 in vacuum lock chamber VL1 (S12). Gate valve G6, G7 shall be opened beforehand. In addition, gate valve G5, G8 shall be closed, and vacuum transfer chamber TM, process chamber PM, vacuum lock chamber VL2 shall be evacuated beforehand.

Then, gate valve G7 may be closed, and the inside of vacuum lock chamber VL1 may be evacuated. If vacuum lock chamber VL1 decreases pressure to a predetermined pressure, gate valve G5 may be opened with closing gate valve G7. Then, wafer W may be picked up from position P3 and may be transferred to position P in process chamber PM by vacuum transfer robot VR (S13).

When wafer W is transferred to the process chamber PM, a process gas may be delivered to process chamber PM and a process for forming a film may be carried out for wafer W (S14). In one embodiment, a metallic thin film shall be formed as mentioned above. A method for forming titanium nitride (TiN) film used for the gate electrode of the transistor is explained hereafter.

A process of forming titanium nitride (TiN) film may be comprised of following four steps. In the first step, wafer W accommodated in process chamber PM may be exposed to titanium tetrachloride (TiCl4) gas as a metal source gas. For example, the discharge of titanium tetrachloride (TiCl4) gas may be maintained within 0.1-1,000 sccm by controlling a mass flow controller. The pressure in process chamber PM may be maintained within 10-1,500 Pa by simultaneously exhausting process chamber PM with an exhaust pump. A feed time of titanium tetrachloride (TiCl4) gas may be within from 0.01 seconds to 300 seconds. The temperature of wafer W may be coordinated within 350-400 degrees Celsius by controlling a heat regulator. Titanium (Ti) component layer having the thickness from less than one molecular layer to several molecular layers may be formed on wafer W by exposing wafer W to titanium tetrachloride (TiCl4) gas.

After stopping the feed of titanium tetrachloride (TiCl4) gas, the process chamber PM may be exhausted by the exhaust pump. An excess titanium tetrachloride (TiCl4) gas after contributing to forming titanium (Ti) component layer in process chamber PM may be removed from the chamber. In addition, by delivering an inert gas into process chamber PM with exhausting process chamber PM, efficiency to remove titanium tetrachloride (TiCl4) gas may increase.

Next, wafer W accommodated in process chamber PM may be exposed to ammonia (NH3) gas as a reactant gas. For example, the discharge of ammonia (NH3) gas may be maintained within 10-3,000 sccm by controlling a mass flow controller. The pressure in process chamber PM may be maintained within 10-1,500 Pa by simultaneously exhausting process chamber PM with the exhaust pump. A feed time of ammonia (NH3) gas may be within from 0.01 seconds to 300 seconds. The temperature of wafer W may be coordinated within 350-400 degrees Celsius by controlling a heat regulator. This ammonia (NH3) gas may react with at least a part of titanium (Ti) component layer formed above. In this way, a part of the titanium (Ti) component layer may nitride and a film of titanium nitride (TiN) may be formed.

After stopping the feed of ammonia (NH3) gas, the process chamber PM may be exhausted by the exhaust pump. An excess ammonia (NH3) gas after contributing to nitriding titanium (Ti) component layer in process chamber PM may be removed from the chamber. In addition, by delivering an inert gas into process chamber PM with exhausting process chamber PM, efficiency to remove ammonia (NH3) gas may increase.

Forming a film of titanium nitride (TiN) may be completed by repeating a predetermined number of times of the four steps mentioned above to the desired film thickness.

After forming the film on wafer W, gate valve G6 may be opened. Treated wafer W may be picked up from the position P and transferred to the position P10 on buffer stage ST2 in vacuum lock chamber VL2 by vacuum transfer robot VR (S15).

Next, gate valve G6 may be closed. A clean gas may deliver to vacuum lock chamber VL2 for returning the pressure in vacuum lock chamber VL2 to atmospheric pressure roughly. Wafer W may be cooled by cooling mechanism not illustrated. Then, gate valve G8 may be opened. Wafer W may be picked up from the position P10 and transferred to an available slot in pod PD on load port LP by atmosphere transfer robot AR (S16).

Then, the controller CNT may determine whether the film formation process in the same process chamber PM has been carried out a predetermined number of times or not (S17). When the film formation process has been carried out a predetermined number of times, cleaning process for this process chamber PM may be carried out (S18). After removing byproducts which formed within process chamber PM in this cleaning process, Step S11-S16 may be continued. On the other hand, if the film formation process was not carried out a predetermined number of times, cleaning process (S18) may be skipped and Step S11-S16 may be continued.

Figure 4:
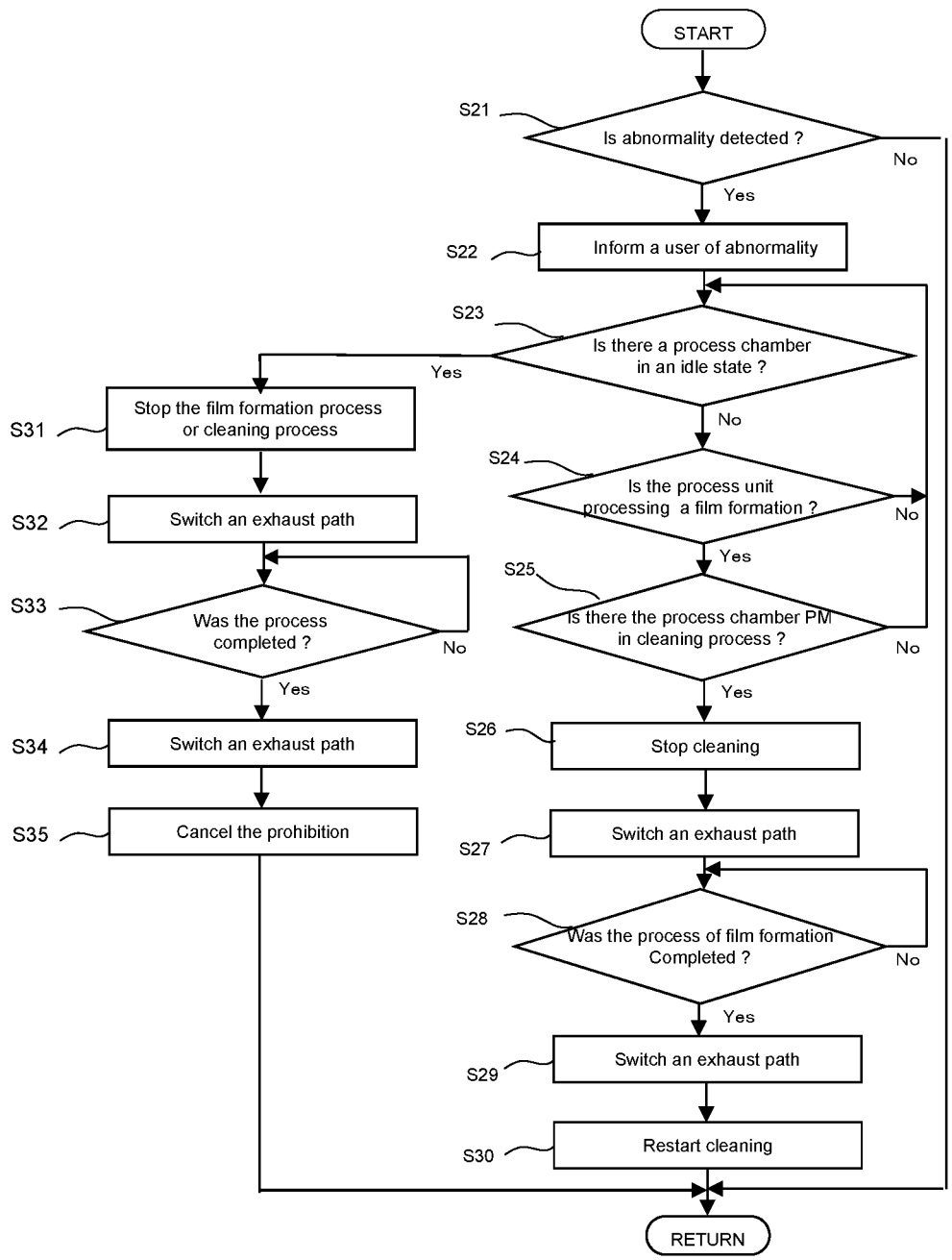
FIG. 4 is a flowchart for explaining a switching process of an exhaust path in the substrate processing apparatus shown in FIG. 1.

Then, switching an exhaust path of the process chamber PM is explained with a reference to FIG. 4. FIG. 4 is a flowchart for explaining a switching process of exhaust path in the substrate processing apparatus shown in FIG. 1. The process shown in FIG. 4 may be executed by controller CNT during the execution for forming a film shown in FIG. 3 (or at least during the execution for forming a film S14).

First, the controller may determine whether an abnormality occurs in either of MBP 214, 224, 234, 244 (S21). This judgment may be performed based on a detective effect of sensor 216, 226, 236, 246. When an abnormality is detected at least one of MBP 214, 224, 234, 244, controller CNT may inform a user of abnormality via operation unit 100 (S22) and seek a process chamber in the idle state (S23). The terminology "idle state" means the states except for the state of forming a film or cleaning the chamber. Said state of forming a film may include the state of transferring wafer W. Whether the process chamber PM is in the idle state or not may be judged from among the process units except the process unit including the BMP detecting abnormality.

When there is no process chamber PM in an idle state (No in S23), controller CNT may judge whether the process unit having BMP detecting abnormality is processing a film formation or not (S24). When the process unit having BMP detecting abnormality is processing a film formation (Yes in S24), controller CNT may judge whether there is the process chamber PM in the cleaning process (S25) or not. Whether there is a process chamber PM is in the cleaning process or not may be judged from among the process units except the process unit including the BMP detecting abnormality.

When there is a process chamber PM in cleaning process (Yes in S25), controller CNT may stop the cleaning process in this process chamber PM (S26) and switch an exhaust path (S27). Switching an exhaust path may be executed by connecting the process chamber PM having MBP detecting abnormality to the MBP in the process unit which cleaning process was stopped. Controller CNT may control the state of each valve 261, 262, 263, 264, 265, 266 in the connecting conduit 251, 252, 253, 254, 255, 256. In this way, the process chamber PM in the process unit having MBP detecting abnormality may be exhausted by the MBP detecting no abnormality.

Next, controller CNT may judge whether the process of film formation was completed or not in the process chamber PM in the process unit having the MBP detecting abnormality (S28). When the process of film formation has not completed yet (No in S28), controller CNT may continue the process until the end of process, when the process of film formation has completed (Yes in S28), controller CNT may switch back the exhaust path to the original exhaust path (S29). At this time, either the process of film formation or the process of cleaning in the process unit having the MBP detecting an abnormality may be prohibited in this process unit after the next time. After switching back the exhaust path to the original exhaust path, the process of cleaning in the process chamber PM where the process of cleaning has been stopped may be restarted (S30).

In this way, when an abnormality of MBP is detected during a film formation process, if there is a process unit during cleaning process, the cleaning process should be stopped, and the process chamber PM during the process of film formation may be exhausted by using the MBP which has used for exhausting the process chamber PM which has processed cleaning process. In this way, the process chamber PM during a film formation process can be maintained at a desired pressure, and a desired film formation process can be continued. Therefore, influence on substrate processing by abnormality of an exhaust pump can be lowered. Particularly, a drop of the productivity can be restrained because lot drop out of wafer W by the poor film formation caused by the abnormality of the exhaust pump can be prevented. The film formation process should be given a priority to complete it because the cleaning process may be performed under the condition that there is no wafer W in process chamber PM.

On the other hand, when there is the process chamber PM in the idle state (Yes in S23), controller CNT may stop the film formation process or cleaning process in this process chamber PM temporarily (S31) and switch an exhaust path (S32). Switching an exhaust path may be executed by connecting the process chamber PM having MBP detecting abnormality to the MBP in the process unit being in the idle state. Controller CNT may control the state of each valve 261, 262, 263, 264, 265, 266 in the connecting conduit 251, 252, 253, 254, 255, 256. In this way, the process chamber PM in the process unit having MBP detecting an abnormality may be exhausted by the MBP detecting no abnormality.

Next, controller CNT may judge whether the process (process of film formation or cleaning process) was completed or not in the process chamber PM in the process unit having the MBP detecting abnormality (S33). When the process has not been completed yet (No in S33), controller CNT may continue the process until the end of process, when the process of film formation has been completed (Yes in S33), controller CNT may switch back the exhaust path to the original exhaust path (S34). At this time, the process of film formation or cleaning in the process unit having the MBP detecting an abnormality may be prohibited in this process unit after the next time. After switching back the exhaust path to the original exhaust path, prohibition of forming a film or cleaning in the process chamber PM which was in the idle state may be canceled (S35).

In this way, when an abnormality of MBP is detected during a substrate processing steps, if there is a process unit during the idle state, the process chamber PM having the MBP detecting an abnormality may be exhausted by using the MBP which was in the idle state. In this way, the process chamber PM during the process can be maintained at a desired pressure, and a desired process can be continued. Therefore, influence on substrate processing by an abnormality of an exhaust pump can be lowered.

When there is no abnormality in MBP 214, 224, 234, 244, controller CNT may skip following steps (No in S21). When a process unit having the MBP detecting an abnormality is not performing a film formation (No in S24), in other words, the process unit is performing a cleaning process, controller CNT may wait until any process unit which is in the idle state appears (go back to S23). If the cleaning process in the process unit having the MBP detecting an abnormality is completed during this waiting, the following steps may be skipped (i.e., it does not change the exhaust path). At this time, at least the process of forming a film or cleaning in the process unit having the MBP detecting an abnormality may be prohibited in this process unit after the next time.

When there is not process chamber PM in cleaning process (Yes in S25), controller CNT may wait until any process unit which is in the idle state or cleaning process appears (go back to S23). If the film formation process in the process unit having the MBP detecting an abnormality is completed during this waiting, following steps may be skipped (i.e., it does not change the exhaust path). At this time, at least one process of film formation or cleaning in the process unit having the MBP detecting an abnormality may be prohibited in this process unit after the next time.

Figure 5:
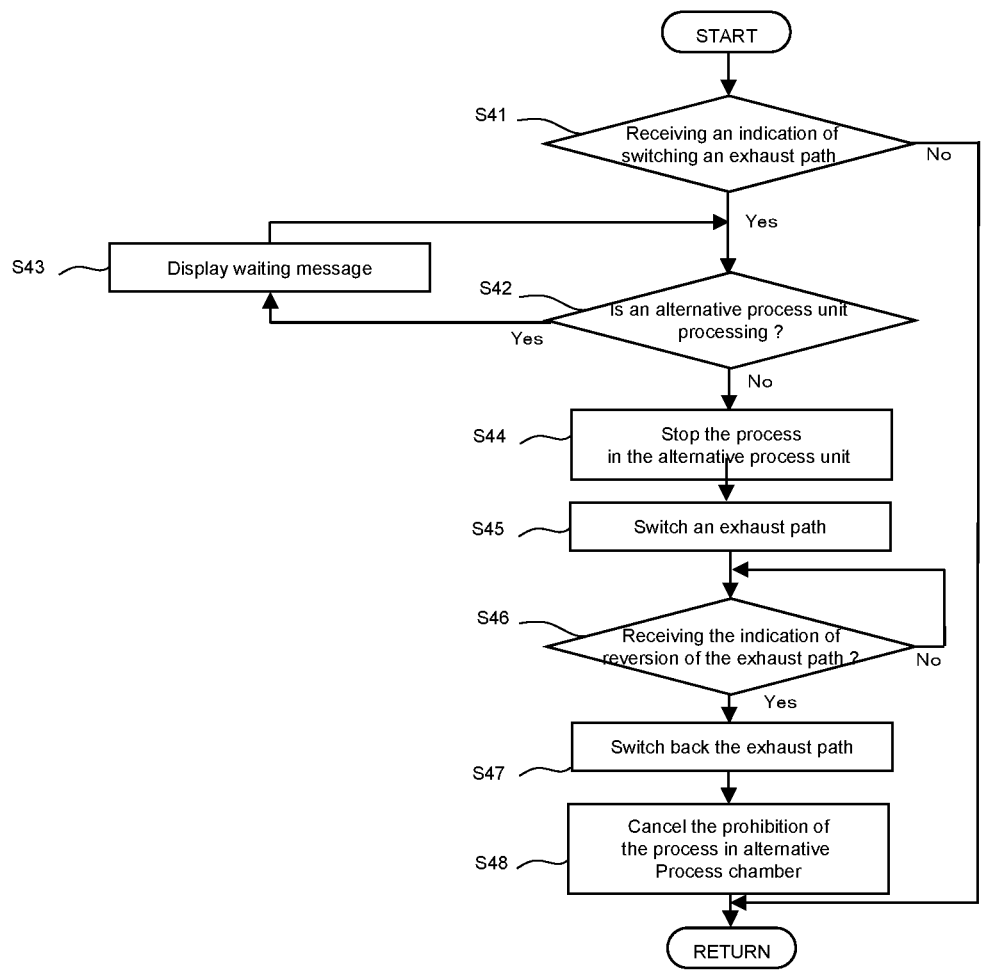
FIG. 5 is a flowchart for explaining a switching process of an exhaust path in the substrate processing apparatus shown in FIG. 1.

In the method shown in FIG. 4, switching an exhaust path may occur based on the abnormality of an exhaust pump. Furthermore, switching an exhaust path may also be executed based on the indication from a user. The method is explained as follows. FIG. 5 is a flowchart for explaining a switching process of exhaust path by the indication from a user. The method shown in FIG. 5 may be executed by controller CNT in the processing at substrate processing apparatus 1.

First, controller CNT may judge whether receiving an indication of switching an exhaust path from a user via operation unit 100 (S41). The indication of switching an exhaust path from a user may include the information for selecting the MBP stopping operation and alternative MBP for exhausting the process unit having the MBP stopping operation. For example, this indication may be input by a user when it performs interchange or maintenance of the MBP.

When the indication of switching the exhaust path from a user is not received, controller CNT may skip following steps (No in S41). On the other hand, when the indication of switching the exhaust path from a user is received (Yes in S41), controller CNT judges whether an alternative process unit is processing (under processing film formation or cleaning) or not (S42). The alternative process unit is a process unit having MBP to use in substitution for MBP stopping operation.

When any process is being performed in the alternative process unit, controller CNT may display waiting message on operation unit 100 until the process is completed (S43). On the other hand, if none of the process are being performed in the alternative process unit (No in S42), controller CNT may stop the process in this alternative process unit temporarily (S44) and switch an exhaust path (S45). Switching an exhaust path may be executed by connecting the process chamber PM having MBP that stop of the operation was indicated to the MBP in the process unit specified by a user. Controller CNT may control the state of each valve 261, 262, 263, 264, 265, 266 in the connecting conduit 251, 252, 253, 254, 255, 256. In this way, the process chamber PM in the process unit having MBP that stopped the operation as indicated may be exhausted by the MBP in another process unit.

Then, controller CNT may judge whether receiving the indication of reversion of the exhaust path from a user via operation unit 100 (S46). The indication of reversion of the exhaust path may be the indication that the MBP being stopped may start again. When controller CNT has not received the indication of reversion of the exhaust path (No in S46), controller CNT waits until receiving the indication of reversion. On the other hand, when controller CNT receives the indication of reversion of the exhaust path (Yes in S46), controller CNT may switch back the exhaust path to the original exhaust path (S47), prohibition of the process in alternative process chamber PM may be canceled (S48).

In this embodiment, as controller CNT may be configured to switch an exhaust path based on the indication of switching an exhaust path from a user, the influence on substrate processing caused by the maintenance etc. can be lower.

In addition, for example, the number of process units in substrate processing apparatus 1 is assumed to be four in this embodiment, the number of process units should not limited to four, should be plural. The embodiment exemplified MBP as an exhaust pump detecting an abnormality, but may be other air pumps including TMP (Turbo Molecular Pump) or the DP (Dry Pump). In addition, switching an exhaust path may switch an exhaust path not only between process chambers PM but also some chambers including vacuum transfer chamber TM, vacuum lock chamber VL in the area described as "The vacuum side" in FIG. 1. In addition, the types of process chambers PM may be not only the chamber for a single wafer tool as explained in this embodiment, but also the chamber for batch type wafer tool such as vertical batch tool.

In another embodiment, exhaust conduit of the process units next to each other may be connected by a connecting conduit. The process chamber PM which is in the idle state or cleaning process in the step S23 or S25 in FIG. 4 may be selected from among the process units PM next to each other. In the step S42 in FIG. 5, the alternative process unit PM which becomes the destination of the exhaust path may be only selected from among the process chambers PM next to the process chamber having the MBP which may stop the operation.

In addition, the exhaust conduit may be connected to the specified exhaust conduit by connecting conduit. For example, a substrate processing apparatus may include a plurality of process units categorized at least two types of process unit. The first at least two process units may include a process chamber respectively for forming the first film on the substrate, the second at least two process units may include a process chamber respectively for forming the second film on a substrate. An exhaust conduit may be connected to the process chamber and an exhaust pump may be arranged in the path of the exhaust conduit. The connecting conduit may include a first connecting conduit connected the exhaust conduit for exhausting the process chamber for forming the first film to another exhaust conduit for exhausting the process chamber for forming the first film and a second connecting conduit connected the exhaust conduit for exhausting the process chamber for forming the second film to another exhaust conduit for exhausting the process chamber for forming the second film. The switching unit may switch an exhaust path of the process chamber to another exhaust pump for exhausting the process chamber for originally forming a same film via the connecting conduit.

In the case of clustered system including a plurality of process chambers which a plurality of chambers are for forming the first film and a plurality of chambers are for forming the second film on the substrate, it is preferable that the exhaust conduit which may exhaust the same gas from the process chamber for forming same film may be connected. For example, in the system forming two kinds of metal films like tantalum (Ta) film and copper (Cu) film on the wafer using two chambers for each forming a film, the exhaust conduit for forming tantalum (Ta) film may be connected to another exhaust conduit for forming tantalum (Ta) film by connecting conduit. And the exhaust conduit for forming copper (Cu) film may be connected to another exhaust conduit for forming cupper (Cu) film by connecting conduit. This configuration may allow the system to continue forming bilayer film under one exhaust pump detecting an abnormality.

Metal film is not limited to tantalum (Ta) film or copper (Cu) film, titanium (Ti) film is included.

Second Embodiment

A substrate processing apparatus regarding the second embodiment is explained. In this second embodiment, the MBP except the MBP that operation was stopped may be configured to use it in common by time division with plural process chambers PM.

Figure 6:
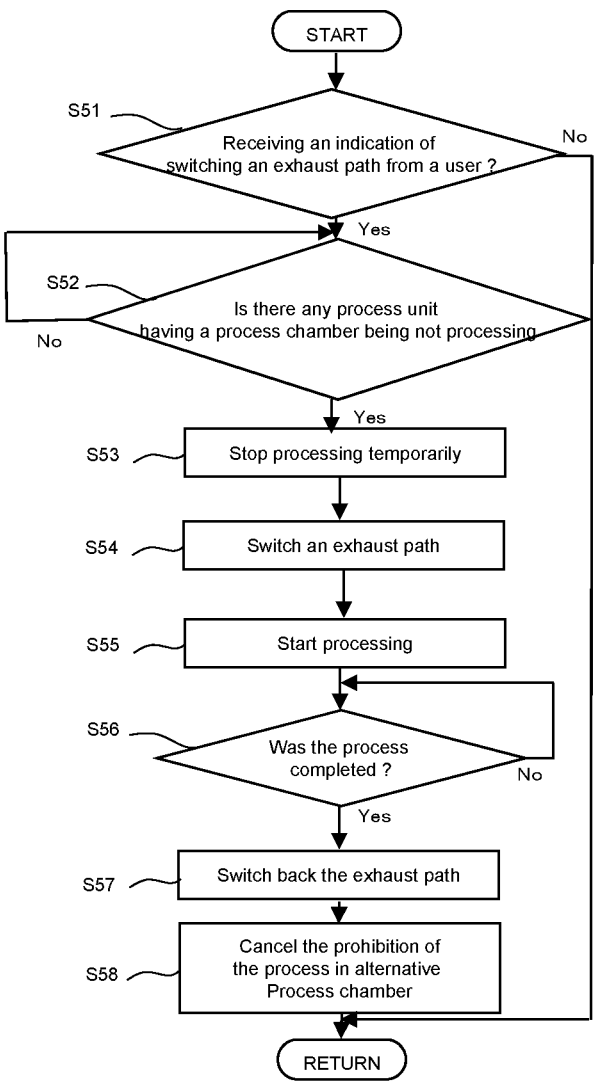
FIG. 6 is a flowchart for explaining a switching process of an exhaust path in the second embodiment in this invention.

FIG. 6 is a flowchart for explaining a switching process of an exhaust path based on the indication from a user in the second embodiment of this invention. Since the configurations of the substrate processing apparatus in the second embodiment is same as one of the substrate processing apparatus in the first embodiment, the explanations regarding the configurations are skipped.

First, controller CNT may judge whether it received an indication of switching an exhaust path from a user via operation unit 100 (S51). The indication of switching an exhaust path from a user may include at least the information for selecting the MBP stopping operation. The indication of switching an exhaust path may include the indication that selection of the MBP for exhausting the process unit having the MBP which may stop operation from among the other MBPs in other process units. This indication is called "Indication for selecting the alternating pump" as follows. When the indication includes the indication for selecting the alternating pump, controller CNT may select the alternative MBP from among one or plural MBPs indicated by the indication for selecting the alternating pump.

When the indication is not included in the indication for selecting an alternating pump, controller CNT may select the MBP from among all of the possible MBPs except for the MBP which may stop operation.

When an indication of switching the exhaust path from a user is not received, controller CNT may skip following steps (No in S51). On the other hand, when the indication of switching the exhaust path from a user is received (Yes in S51), controller CNT judges whether or not there is any process unit having a process chamber PM being not processing, among other process units having alternative MBPs. For example, controller CNT judges whether or not there is any process unit which is in idle state or in waiting for transferring wafer W. When there is no process unit not processing any process (No in S52), controller CNT may wait until the process unit which is not processing appears.

On the other hand, when there is the process unit which is not processing any process (Yes in S52), the possible process which should be processing in this process unit may be temporarily stopped (S53) and an exhaust path may be switched (S54). Switching an exhaust path may be executed by connecting the process chamber PM having MBP that stop of the operation is indicated to the MBP in the process unit which is under not processing any process. Controller CNT may control the state of each valve 261, 262, 263, 264, 265, 266 in the connecting conduit 251, 252, 253, 254, 255, 256. In this way, the process chamber PM having MBP that stop of the operation is indicated may be exhausted by the MBP in another process unit.

Then, the process (process for forming a film or cleaning) in process chamber PM having MBP that stop of the operation is indicated may start processing (S55), Next, controller CNT may judge whether the process was completed or not. When the process is not completed (No in S56), controller CNT waits for the completion of the process. When the process is completed (Yes in S56), controller CNT may switch back the exhaust path to the original exhaust path (S57), prohibition of the process in alternative process chamber PM may be canceled (S58). Then the control may go back to the step S51.

In this embodiment, the configuration that switching an exhaust path based on the indication by a user can lower the influence on substrate processing caused by the maintenance of an exhaust pump. Especially, in this embodiment, since the substrate processing apparatus may be configured to use the exhaust pump which is not processing in common by time division, handling of whole substrate processing apparatus may become more efficient. In addition, the priority of selecting the alternative pump may be changed depending on the process, for example, when the film is processing in the process chamber PM having BMP that is indicated the stop of the operation, the exhaust pump for cleaning process may be assigned to the alternative pump. When the cleaning process is performed in the process chamber PM having BMP that indicated the stopping of the operation, the exhaust pump in the process unit that is in idle state may be assigned to the alternative pump.

Third Embodiment

A substrate processing apparatus regarding the third embodiment is explained. In this third embodiment, one or more process chambers PM may allow performing a different process. Specifically, the substrate processing apparatus in this embodiment may be configured as a process integration apparatus which can continually perform different processes regarding a manufacturing process of the semiconductor device. The case processing a part of the manufacturing process of the gate of the transistor as a process integration apparatus may be explained.

Figure 7:
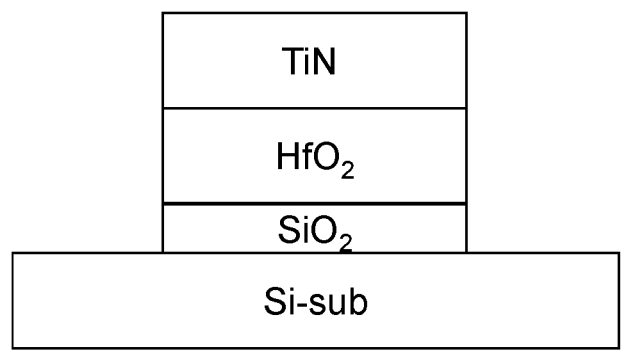
FIG. 7 is an illustrative cross sectional view of a transistor having a gate formed by using a substrate processing apparatus of third embodiment in this invention.

FIG. 7 is an illustrative cross sectional view of a transistor having a gate formed by using a substrate processing apparatus of third embodiment in this invention. Specifically, it is the drawing indicating the configuration example of the gate of the transistor of the NMOS type. As shown in FIG. 7, the gate may have the stack structure which laminated gate electrode comprises the metal nitride (for example, Titanium nitride (TiN)) formed on high dielectric constant film (High-k film, for example, hafnium oxide (HfO2)film) formed on silicon insulator film (for example, silicon oxide (SiO2) film) formed on the silicon substrate (Si-sub).

(Gate Manufacturing Process)

Figure 8:
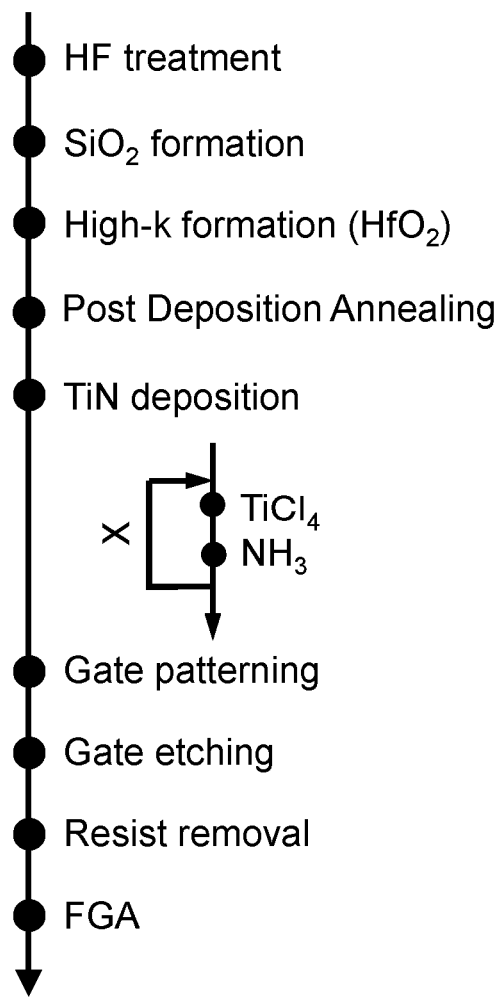
FIG. 8 is a flowchart for explaining an example of a manufacturing process of the gate of the transistor shown in FIG. 7.

The example of manufacturing process of the gate of the transistor shown in FIG. 7 is explained. FIG. 8 is a flowchart for explaining an example of manufacturing process of the gate of the transistor shown in FIG. 7.

(Step of HF Treatment).

As shown in FIG. 8, a sacrifice oxide film formed in a silicon substrate may be removed by soaking the silicon substrate into a 1% HF aqueous solution.

(Step of SiO2 Formation)

Then, a silicon oxide (SiO2) film may be formed on the silicon substrate by a thermal oxidation process. The silicon oxide (SiO2) film may be formed as interlayer in the boundary surface with silicon substrate and a hafnium oxide (HfO2) film to form later.

(Step of High-K Formation (HfO2))

Then, the hafnium oxide (HfO2) film as the high dielectric constant film may be formed on the silicon oxide (SiO2) film. The gate insulator film may be comprised of the silicon oxide (SiO2) film and the hafnium oxide (HfO2) film.

(Step of Post Deposition Annealing)

After forming the hafnium oxide (HfO2) film, the substrate may be annealed. The purpose of this annealing step is to remove impurities in the hafnium oxide (HfO2) film, do densely or crystallize the hafnium oxide (HfO2) film.

(Step of TiN Deposition)

Then, the titanium nitride (TiN) film as the gate electrode may be formed on the hafnium oxide (HfO2) film. The method for forming the titanium nitride (TiN) film may include exposing the substrate to a titanium tetrachloride (TiCl4) gas and exposing the substrate to an ammonia (NH3) gas, wherein a cycle including exposing the substrate to a titanium tetrachloride (TiCl4) gas and exposing the substrate to an ammonia (NH3) gas may be performed X times. X is integer more than 1.

(Step of Gate Patterning)

Then, Gate patterning may be performed by using the photolithography technique with a resist as mask.

(Step of Gate Etching)

Then, Gate etching may be performed by using the dry etching technology.

(Step of Resist Removal)

Then, the resist may be removed from the substrate.

(Step of FGA)

Then, forming gas annealing (FGA) including hydrogen (H2) gas annealing may be performed, In the substrate processing apparatus in this embodiment, step of $SiO_2$ formation, step of High-K formation (HfO2), step of Post Deposition Annealing or step of TiN deposition may be performed in process chamber PM1-PM4 shown in FIG. 1 or FIG. 2.

Specifically, step of SiO2 formation may be performed in process chamber PM1, step of High-K formation (HfO2) may be performed in process chamber PM4, Step of Post Deposition Annealing may be performed in process chamber PM3 and step of TiN deposition may be performed in process chamber PM2. Therefore, in this embodiment, gas delivery system GS1 connected to process chamber PM1 may include a source of the oxidant for a thermal oxidation process. Gas delivery system GS3 connected to process chamber PM3 may include a source of the inert gas for an anneal process. Gas delivery system GS4 connected to process chamber PM4 may include a source of the gas containing a hafnium and a source of the oxidant. The configuration of gas delivery system GS2 connected to process chamber PM2 may be similar to the first embodiment.

In this embodiment and the first embodiment, the processes performed in process chamber PM1, PM3 or PM4 may be different, but basic configurations as a substrate processing apparatus are common.

In this embodiment, the characteristic point is the arrangement of process chambers PM based on the consideration of the load of each exhaust pump in each process. Though, various parameters such as number of revolutions or a running time are regarded as the load of the exhaust pump, we considered that quantity of the particle may become one of the main factors to cause abnormality to the exhaust pump MBP or dry pump DP.

Generally, the process for forming a thin film such as a hafnium oxide (HfO2) film or a titanium nitride (TiN) film may be easy to produce particles more in comparison with the thermal oxidation process or the anneal process.

Particularly, in a nitride film such as a titanium nitride (TiN) film, the film which formed within process chamber PM may be easy to exfoliate by a stress. In addition, it is known that when the material containing halogen, such as a titanium tetrachloride (TiCl4), is used in the process for forming a titanium nitride (TiN) film, many byproducts caused by a bond of halogen element and nitride agent may be produced. In other words, the processes for forming a hafnium oxide (HfO2) film or a titanium nitride (TiN) film may be easy to produce particles in comparison with the other processes mentioned above. Particularly, many particles may flow out from process chamber PM into gas exhaust system GE. When the particles which flowed out into the exhaust system GE attaches to exhaust pump MBP or dry pump DP, it can cause the abnormality of these pumps.

Therefore, in this embodiment, the process chamber PM for forming a titanium nitride (TiN) film may be located in the nearby or neighboring position of the process chamber PM that may perform the process producing a relatively small quantity of particles, such as a thermal oxidation process or an anneal process. In this way, possibility to continue the process for forming a titanium nitride (TiN) film may be raised by using the alternative exhaust pump which may be originally assigned to the process that particles may be hard to relatively produce and may located in the nearby or neighboring position of the process chamber PM for forming a titanium nitride (TiN) film. By using commonly exhaust pump BMP or dry pump DP of the processing unit located in the nearby or neighboring position, the length of the connecting conduit can be shortened. This is advantageous at a point of view reducing pressure loss. In this embodiment, the arrangement of the processing unit may be set based on the load of the exhaust pump. It is preferable that the process unit including the exhaust pump bearing higher load is located in the nearby or neighboring position of the process unit including the exhaust pump. For example, by only connecting exhaust pump to the possibly alternative exhaust pump located in the nearby or neighboring position of the chamber, the possibility to continue the process may be raised.

The method of switching an exhaust path mentioned in the first embodiment or second embodiment can apply to this embodiment. Therefore, the influence on substrate processing process caused by the abnormality or maintenance of the exhaust pump can be lowered.

What is claimed is:

1. A substrate processing apparatus comprising:
   a first process unit including:
   a first process chamber for processing a substrate,
   a first exhaust path connected to at least the first process chamber, the first exhaust path including a first pump and a first auxiliary pump, the first pump and the first auxiliary pump being arranged sequentially from an upstream side in the first exhaust path, and
   a first sensor, connected to the first pump, configured to monitor a condition of the first pump;
   a second process unit including:
   a second process chamber for processing a substrate,
   a second exhaust path connected to at least the second process chamber, the second exhaust path including a second pump and a second auxiliary pump, the second pump and the second auxiliary pump being arranged sequentially from an upstream side in the second exhaust path, and
   a second sensor, connected to the second pump, configured to monitor a condition of the second pump;
   a switching system, having a path connecting between a first point upstream of the first pump in the first exhaust path and a second point upstream of the second pump in the second exhaust path, the path including a connecting valve disposed between the first point and the second point; and
   a controller connected to the first sensor, the second sensor, and the connecting valve, the controller configured to:
   get the condition of the first or second pump, respectively from the first or second sensor,
   determine whether at least one of the first pump or the second pump is an abnormal state by comparing the condition with a condition of the stationary state and
   provide an indication of an abnormality of at least one of the first pump and the second pump,
   wherein the first pump is configured to pump the first process chamber to a high vacuum and the first auxiliary pump is configured to pump the first process chamber from a low rough vacuum to an atmospheric pressure in a stationary state, and the second pump is configured to pump the second process chamber to a high vacuum and the second auxiliary pump is configured to pump the second process chamber from a low rough vacuum to an atmospheric pressure in a stationary state.

2. The substrate processing apparatus according to claim 1,
   wherein the first sensor is configured to monitor a first pressure as the condition of the first pump and the second sensor is configured to monitor a second pressure as the condition of the second pump and
   the controller is configured to determine whether at least one of the first pump and the second pump is in an abnormal state by comparing the first pressure with a pressure of a stationary state and comparing the second pressure with the pressure of a stationary state, respectively.

3. The substrate processing apparatus according to claim 2, wherein the controller is further configured to:
   receive an indication to switch between the first exhaust path and the second exhaust path, and
   control the connecting valve to switch between the first exhaust path and the second exhaust path in response to the indication.

4. The substrate processing apparatus according to claim 3, wherein the switching system is further comprising:
   a first valve, disposed in the first exhaust path downstream of the first point, and upstream of the first pump; and
   a second valve, disposed in the second exhaust path downstream of the second point, and upstream of the second pump.

5. The substrate processing apparatus according to claim 4, wherein the controller is further configured to control the switching system to:
   close the first valve when the first exhaust path is determined as being in the abnormal state and close the second valve when the second exhaust path is determined as being in the abnormal state, and
   open the connecting valve.

6. The substrate processing apparatus according to claim 1, wherein the first pump is disposed downstream of a first valve, and the second pump is disposed downstream of a second valve.

7. The substrate processing apparatus according to claim 6,
   wherein the first sensor is configured to monitor at least one of a number of revolutions, watt consumption and a temperature of the first exhaust pump and the second sensor is configured to monitor at least one of the number of revolutions, watt consumption, and a temperature of the second exhaust pump, and
   the controller further is configured to determine whether at least one of the first exhaust path and the second exhaust path is in the abnormal state by comparing:
   the at least one of the number of the revolution, watt consumption, the temperature of the first exhaust pump with one of a number of revolutions, watt consumption, the temperature of the first exhaust pump at the stationary state; and
   the at least one of the number of the revolution, watt consumption and the temperature of the second exhaust pump with one of the number of revolutions, watt consumption, and the temperature of the second exhaust pump at the stationary state.

8. The substrate processing apparatus according to claim 7, wherein the controller further configured to:
   receive an indication to switch between the first exhaust path and the second exhaust path, and
   control the switching system to switch between the first exhaust path and the second exhaust path in response to the indication.

9. The substrate processing apparatus according to claim 8, wherein the controller is further configured to control the switching system to: close the first valve when the first exhaust path is determined as being in the abnormal state and close the second valve when the second exhaust path is determined as being in the abnormal state, and open the connecting valve.

10. The substrate processing apparatus according to claim 1,
    wherein the first sensor is configured to detect at least one of a number of revolutions, watt consumption, and a temperature of the second exhaust pump and the second sensor is configured to detect at least one of a number of revolutions, watt consumption, and a temperature of the second exhaust pump.

* * * * *